United States Patent [19]

Elliott et al.

[11] Patent Number: 4,551,623
[45] Date of Patent: Nov. 5, 1985

[54] PHOTOCONDUCTIVE DETECTOR WITH AN A/C BIAS AND RESPONSIVITY DEPENDENT UPON THE POLARITY OF THE BIAS

[75] Inventors: Charles T. Elliott; Anthony M. White, both of Malvern, England

[73] Assignee: The Secretary of State for Defence in Her Britannic Majesty's Government of the United Kingdom of Great Britain and Northern Ireland, London, England

[21] Appl. No.: 441,867

[22] Filed: Nov. 15, 1982

[30] Foreign Application Priority Data

Dec. 7, 1981 [GB] United Kingdom ............... 8136751

[51] Int. Cl.⁴ ............................................. H01J 40/14
[52] U.S. Cl. .......................... 250/211 R; 250/214 R; 250/578
[58] Field of Search ............... 250/214 R, 578, 211 R, 250/211 J, 338, 332, 211 K, 206; 307/311; 357/30

[56] References Cited

U.S. PATENT DOCUMENTS 2,930,999  3/1960  Van Santen et al.
3,033,073  5/1962  Shuttleworth .................. 250/211 K
3,414,730  12/1968  Nicolas ........................ 250/211 K
3,699,345  10/1972  Parkin .......................... 250/211 K X
3,931,515  1/1976  Parkin ........................... 250/338 X

FOREIGN PATENT DOCUMENTS 0057958  1/1982  European Pat. Off.
2349233  4/1974  Fed. Rep. of Germany.
3139542  4/1983  Fed. Rep. of Germany.
0840095  7/1960  United Kingdom.
1401923  8/1975  United Kingdom.

Primary Examiner—Edward P. Westin
Attorney, Agent, or Firm—Cushman, Darby & Cushman

[57] ABSTRACT

An alternating bias is applied to a modified photoconductive detector and photosignal extracted from each detector element. This extraction may be performed using an integrator to produce a dc signal output, or alternatively by using a high-pass filter or phase-sensitive detector to extract a photosignal at an harmonic of the bias frequency. The detector used is provided with elements that have a responsivity that is a different function of bias amplitude for each polarity. The detector element may be shaped with variation in width or depth, to produce this differential responsivity. Alternatively element bias contacts may be of different width to produce field gradient and differential responsivity. It is advantageous to obscure a part of each element area by including an opaque mask.

10 Claims, 10 Drawing Figures

PHOTOCONDUCTIVE DETECTOR WITH AN A/C BIAS AND RESPONSIVITY DEPENDENT UPON THE POLARITY OF THE BIAS

TECHNICAL FIELD

This invention concerns a method of photoconductive detector biassing, a detector apparatus, and, a photoconductive detector adapted for use in the detector apparatus. In particular it concerns a detector apparatus including: a detector comprising at least one photoconductive element, a bias source, connected to the detector, for applying bias to each element of the detector; and, an output circuit connected to each element, responsive to an electrical output signal from each element, to extract from each electrical output signal, a photosignal dependent on the intensity of radiation incident upon each element; and, in particular a method of biassing a photoconductive detector wherein bias is applied to each element of the detector and a photosignal dependent on radiation intensity is extracted from the output signal produced by each element.

Photoconductive detectors, particularly those sensitive to infra-red radiation have been considered for use in imaging applications. They may also find application in future laser communication and laser rangefinding systems.

BACKGROUND ART

Conventional photoconductive detectors comprise one or more square elements of photosensitive material, each element having a pair of spaced bias contacts. For imaging applications, such a detector is placed in the image plane of an optical assembly and is usually shielded to reduce the incidence of background illumination upon the detector. The detector is usually mounted on a cold stage and is cooled to enhance signal-over-noise discrimination. In one form of conventional detector apparatus using intrinsic photoconductive elements responsive to the middle and far infra-red region of the spectrum, a steady direct current (DC) bias, from a constant current source, is applied to each element. There is thus developed across each detector element a bias pedestal voltage, a voltage dependent on bias current magnitude and element resistance. When radiation of appropriate wavelength is incident upon the detector elements, photosignals—in this case photovoltages—are developed and these increment the voltage provided by each element. The incremental photosignal voltage is, for normal radiation intensities, of magnitude several orders smaller than the magnitude of the bias pedestal, and it is usual to back-off each element voltage by subtracting DC voltage to allow extraction and amplification of the photosignal component. However, to be wholly effective the back-off voltage applied, in each case, must follow changes in the pedestal voltage. Such changes may occur, for example, as a result of cold stage temperature drift, of change in ambient temperature, of change of average background illumination, and of current drift. Such pedestal voltage changes are in general also orders of magnitude higher than the photosignal increment. Furthermore the pedestal voltage and the change of this voltage will vary from element to element. In general the resistance of each element will differ, since material resistivity and element dimensions vary within manufacturing tolerance. Because of non-uniformities in the bias pedestal, it is in the very least difficult, if not impractical, in unscanned, so-called "staring" systems, to back off element voltage satisfactorily so that the wanted illumination dependent photosignal can be extracted without the introduction of an unacceptable degree of fixed pattern noise. It is also possible to operate these detectors using constant voltage drive bias instead of constant current in which case device current is measured. This too requires bias compensation, and this likewise introduces fixed pattern noise.

Because of these difficulties, progress in photoconductive detector development is impeded and this development is giving way to the alternative development of photovoltaic detectors; albeit this latter involves a more complex, generally more expensive and less far advanced technology.

DESCRIPTION OF THE INVENTION

This invention is intended to provide a remedy; a method of biassing, detector apparatus, and, a photoconductive detector, all facilitating the extraction of useful illumination dependent photosignal from detector element response voltage or current.

According to a first aspect of the invention there is provided a method of biassing a photoconductive detector characterized in that the bias applied is an alternating bias; and, the photoconductive detector, to which the bias is applied, includes at least one photoconductive element having a responsivity variable in different degree dependent upon the polarity of the bias.

According to a second aspect of the invention there is provided detector apparatus for performing the method of biassing, as above, characterized in that the bias source is a source of alternating bias; and, the photoconductive detector includes at least one photoconductive element having a responsivity variable in different degree dependent upon the polarity of bias.

According to a third aspect of the invention there is provided a photoconductive detector including at least one photoconductive element, each element being characterized by a responsivity variable in different degree dependent upon polarity of bias.

The term "responsivity" used herein refers to that element output signal increment—an increment in voltage for current bias, or an increment in current for voltage bias—produced when unit illumination intensity of radiation of appropriate wavelength is incident upon each photoconductive element.

The detector apparatus may include at least one photoconductive element, each element being adapted to develop a graded non-uniform bias electric field along its length in response to applied bias, thereby having a polarity dependent responsivity. Each element may have a width and/or a depth which changes along the length of the element. The change may be continuous or abrupt, i.e., a gradual or stepwise change. Alternatively, each element may be provided with bias contacts of different width, to thus develop a non-uniform field. As a further alternative each element may have a graded dopant concentration, or graded surface treatment. Contacts with different recombination properties—for example one contact being an accumulating contact, the other a non-accumulating contact—may be used to produce the desired field non-uniformity.

When bias is applied to any one of the detector elements described above, and radiation of appropriate wavelength is incident upon the element, photocarriers are generated in the material bulk and are caused to drift in a direction dependent on the polarity of the bias. Thus for one polarity of the bias the photocarriers drift towards a higher field, and for the other polarity they drift towards a lower field. In a swept-out detector element, the signal contributed by each photocarrier is proportional to the potential difference through which it drifts on its way to the output contact. In each of the elements described above, the electric field is non-uniform and the potential V is dependent on carrier position (x,y). Thus where the potential has a value $V_o$ at one end contact and a value $V_1$ at the other, $V_1 > V_o$, the signal developed by the swept-out photocarriers will in one case be proportional to $\Sigma[V(x,y) - V_o]$ and in the other it will be proportional to $\Sigma[V_1 - V(x,y)]$. Since the electric field is graded, these two sum signals will differ—the response is different for the two flow directions. However, in contrast to this, in the absence of illumination, each element behaves as a linear device, and there is no difference in response magnitude.

To advantage, a part of the area of each element may be obscured by an opaque mask to give added emphasis to the different photorespose for positive and negative polarity bias.

Each element behaves in a manner similar to a half-wave rectifier, since it gives an enhanced signal on one half of the bias cycle. To advantage, therefore, complementary elements may be connected together in pairs. Alternatively each pair may be siamesed together to form a respective single unit.

Where the elements are shaped in width, appropriate shapes may be chosen to allow close packing of the elements in a one dimensional or two dimensional array.

When alternating bias is applied to an illuminated element, the element response signal—a voltage or a current signal—may be integrated to produce a DC signal. The level of this signal will depend on the intensity of the radiation incident on the element. However, in the absence of radiation, the element behaves as a linear device and the element response signal is of truly alternating character. Thus when this response signal is integrated, the output DC signal level is zero. It is thus possible to separate the photosignal and bias of the overall response signal.

Alternatively, an useful photosignal may be extracted by harmonic separation, using either a high-pass filter to block a signal at the bias frequency, or a phase-sensitive detector.

DESCRIPTION OF THE EMBODIMENTS

Embodiments of the invention will now be described, by way of example only, with reference to the drawings.

Figure 1:
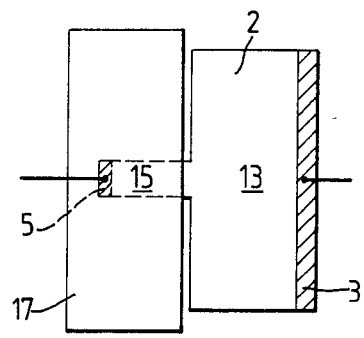
FIG. 1 is a plan drawing of a detector element of modified shape.
Figure 2:
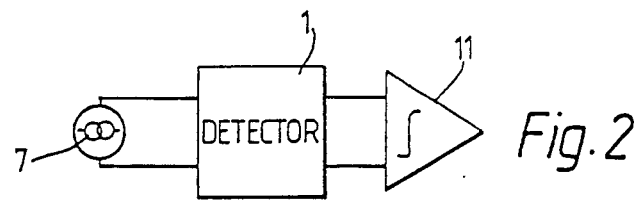
FIG. 2 is a schematic block diagram of detector apparatus incorporating a detector including the element shown in the preceding figure.
Figure 3:
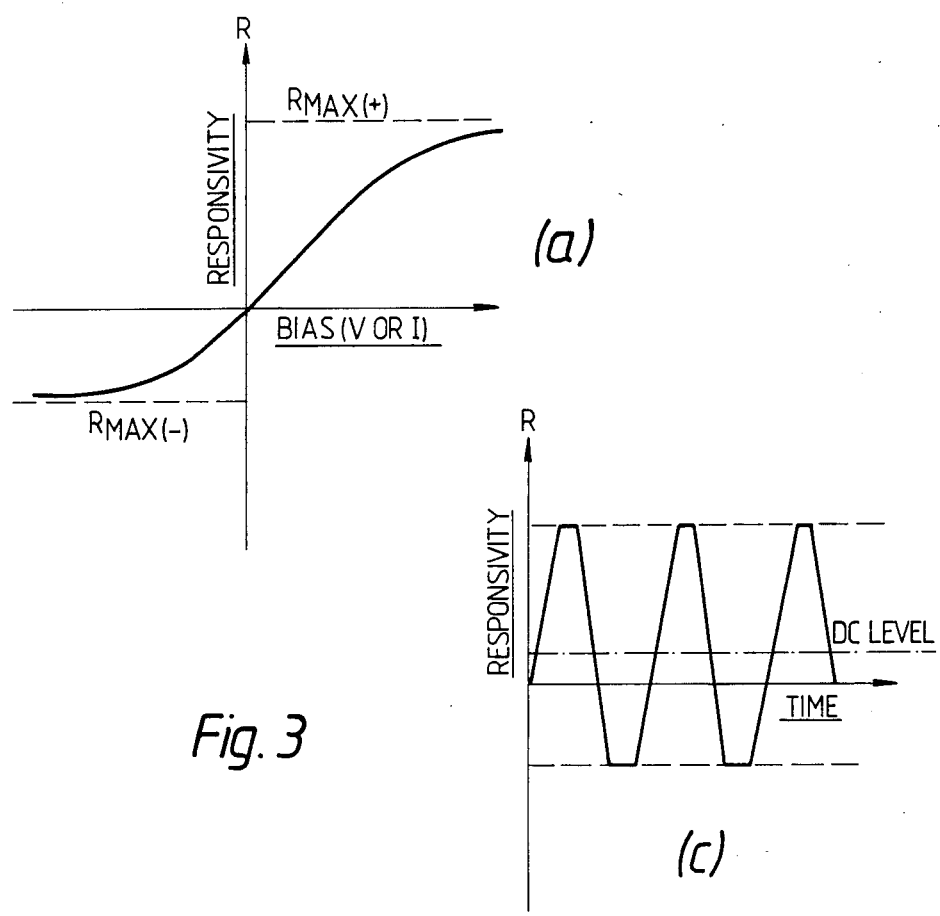
FIG. 3 shows (a) a graph showing the responsivity of the element of FIG. 1 as a function of bias magnitude and polarity; (b) an applied bias waveform; and (c) a photosignal response waveform.

There is shown in FIG. 1 a shaped detector element 2 of n-type cadmium mercury telluride infra-red sensitive material, material sensitive to radiation in the 8–14μ window band of the electromagnetic spectrum. It has gold metal contacts 3 and 5, one at either end. This element 2 has been etch-cut from a square 50μ wide, 50μ long and 10μ deep and has a narrow region 15 10μ wide by 15μ long—and a broad region 13 50μ wide by 35μ long. The element 2 has a typical surface resistivity of between 12 and 50 Ω/☐ (ohms per square). The element 2 is thus designed to give on application of bias, between the bias contacts 3 and 5, a bias electric field that varies with distance along the length of the element, a field that is higher in the narrow region 15 and lower in the broad region. As shown in FIG. 2, alternating bias, a current bias, is applied from a high impedance source 7 and the detector element response, a voltage response, is applied to the inputs of a high impedance output circuit 11, an integrating amplifier. The photosignal component of the response voltage is shown in FIG. 3(c). As can be seen from the graph, FIG. 3(a), the responsivity varies with both bias magnitude and bias polarity. For low values of bias magnitude, the responsivity in each quadrant is linear. In this regime, photocarriers are lost by recombination in the material bulk. At higher and lower values of bias magnitude the responsivity varies non-linearly and in each quadrant a maximum responsivity $R_{max}$ (positive or negative) is attained asymptotically. This occurs as photocarrier recombination at the bias contacts becomes the dominant loss mechanism, the photocarriers being "swept-out" at one or other or both of the bias contacts 3 or 5. However, for one polarity of the bias, 3, the contact adjacent the broad region 13 of the element 2, is at bias negative. The photocarriers are caused to drift towards this contact 3. Those few photocarriers generated in the high field narrow region, drift in the high field in the narrow region 15 and the low field in the broad region 13. The greater remainder drift in only the low field in the broad region 13. The responsivity for this polarity is thus low. For the other polarity, the other contact 5 is at negative bias. The photocarriers generated in the element drift in the reverse direction and towards this contact 5. In this case, however, the majority of the photocarriers drift in both the low field in the broad region 13 and in the high field in the narrow region 15. The responsivity for this opposite polarity is therefore higher. The difference in responsivity may be enhanced still further using an opaque mask 17 to cover the narrow region 15 of the element 2. In this way a responsivity ratio:

$$\frac{\text{Maximum responsivity (forward bias)}}{\text{Maximum responsivity (reverse bias)}} = \frac{R_{max}(+)}{R_{max}(-)}$$

of approximately 3.0 can be achieved for this design of element, though this can varied widely by modifications of the device dimensions. An alternating current of peak amplitude 1 to 5 mA allows ranging over a major portion of the responsivity characteristic (of FIGS. 3(a) and 3(b)) and this is optimized to give good output signal strength for modest dissipation of power. The element output response includes a larger linear alternating component on which the non-linear photoresponse in illumination is superimposed. The variation of the photosignal, which is shown in FIG. 3(c) thus have a waveform that is non-linear and clipped to different degree in successive half-cycles. When the response is passed through the integrating amplifier 11 the linear bias component of this response signal is integrated at zero. Because, however, the photosignal component of the response signal is assymmetric (see FIG. 3(c)) it gives, on integration, a finite DC signal. This signal is a linear function of the intensity of radiation incident upon the element 2 of the detector 1.

Figure 4:
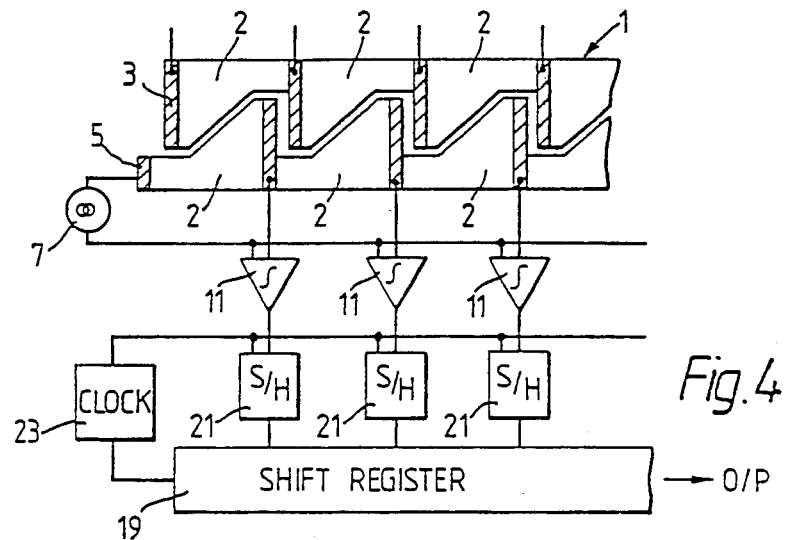
FIG. 4 is a block diagram of detector apparatus incorporating a detector including a doubled row array of interleaved elements.

This method of biassing may be applied to a detector including a double row of shaped elements 2, as is shown in the apparatus of FIG. 4. The output bias contact 5 of each detector element 2 is connected to the input of an integrating amplifier 11. The output of each amplifier 11 is then fed to a delay line shift register 19 through a sample and hold (S/H) circuit 21. The sample and hold circuits 21 and the shift register are then triggered periodically to produce, at the output O/P of the register 19, a serial read-out signal. This read-out signal is then relayed to display or other monitoring circuitry.

Since the response signal developed by each element is non-linear, instead of being processed by integration, the signal may instead be passed to a high pass filter or to a phase-sensitive detector to separate one or more harmonics (2nd, 3rd etc) of the photosignal from the bias frequency signal.

Figure 5:
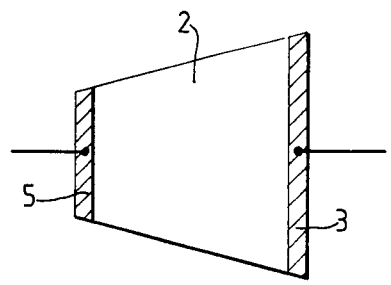
FIGS. 5 to 7 are plan drawings of detector elements of different design to the element shown in FIG. 1.
Figure 6:
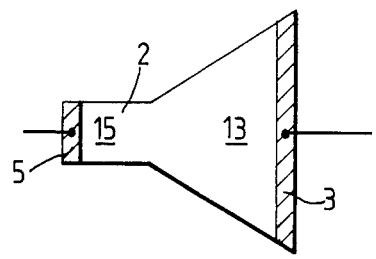
Figure 7:
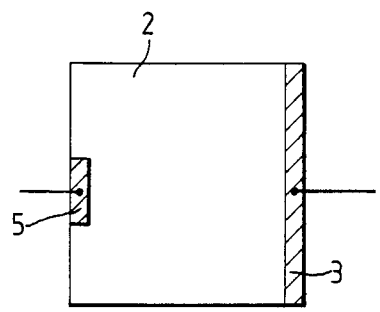

Alternative designs of photoconductive elements are shown in FIGS. 5 to 7. In FIG. 5 the element 2 is of trapezoid shape, 50μ long with two contacts, one 10μ wide, the other 60μ wide. In FIG. 6, the element 2 has a broad region 13 of trapezoid shape from which a narrow region 15 extends. The element 2 is 50μ long and has two contacts one 10μ wide, the other 60μ wide. The narrow region 15 is 12μ long. In FIG. 7 the element is 50μ square but has a contact of restricted length of 6μ, the other contact being—50μ in length. Elements of these configurations of cadmium mercury telluride material the same as the example of FIG. 1, have been examined and it has been shown that these too exhibit an asymmetric responsivity.

The elements 2 may also be shaped to allow close packing in a two dimensional array as shown for the detector of FIG. 4. In this way the useful photoconductive material area can be optimized. The elements of this detector are overlaid by metal contacts 3 and 5 and the adjacent rows of elements are interleaved. The whole array may be etch-cut from a single slice of photoconductive material.

Figure 8:
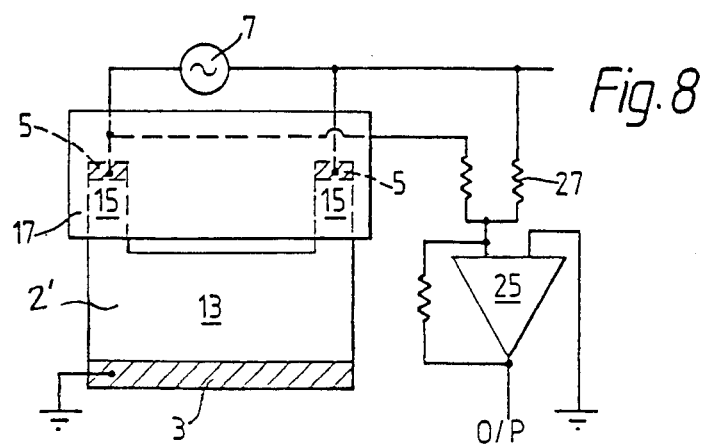
FIG. 8 is a drawing of detector apparatus including a combination element.

In FIG. 8 a combination or siamesed element 2' is shown. This element 2' is in the form of a three contact device having one contact 3 to a broad region 13 of the element, and two further contacts 5 each one to a corresponding narrow region 15 of the element 2'. Bias is applied to the smaller two contacts 5. Each side of the detector operates on alternate half-cycles with the output added at the summing input of an amplifier 25. The linear bias signal component is cancelled in the input circuit 27 of the amplifier.

We claim:
1. A photoconductive detector apparatus including:
   at least one photocondutive element arranged for a responsivity change with a change in bias voltage polarity,
   an AC bias source arranged for biassing said at least one photoconductive element, and
   an output circuit arraged to provide a response to a photoconductive element output signal component differing in frequency from that of the AC bias source.

2. An apparatus according to claim 1 wherein the output circuit includes an integrator arranged to provide a DC response to the said output signal component.

3. An apparatus according to claim 1 wherein the output circuit includes a high pass filter arranged to transmit the said output signal component and to attenuate the bias frequency.

4. An apparatus according to claim 1 including a phase-sensitive detector arranged to detect the said output signal component.

5. An apparatus according to claim 1 including at least one pair of complementary photoconductive elements arranged to provide maximum responsivity in antiphase.

6. An apparatus according to claim 5 wherein the said at least one pair of complementary photoconductive elements is a siamesed pair.

7. An apparatus according to claim 1, wherein the said at least one photoconductive element is arranged to develop a graded non-uniform bias field when biased.

8. An apparatus according to claim 7 wherein the said at least one photoconductive element has at least one transverse linear dimension which varies longitudinally.

9. An apparatus according to claim 7 wherein the said at least one photoconductive element has bias contacts of differing width.

10. An apparatus according to claim 1 including masking means for partial obscuration of the said at least one photoconductive element.

* * * * *